United States Patent [19]
Kayanuma et al.

[11] Patent Number: 6,156,587
[45] Date of Patent: Dec. 5, 2000

[54] METHOD OF ATTACHING SOLID STATE IMAGING DEVICE

[75] Inventors: Yasunobu Kayanuma; Masaaki Orimoto; Takeshi Misawa, all of Asaka, Japan

[73] Assignee: Fuji Photo Film Co., Ltd., Kanagawa, Japan

[21] Appl. No.: 09/259,292

[22] Filed: Mar. 1, 1999

[30] Foreign Application Priority Data

Mar. 2, 1998 [JP] Japan .................................. 10-049839

[51] Int. Cl.[7] .................................................. H01L 21/44
[52] U.S. Cl. ......................... 438/106; 257/718; 257/719; 361/756; 361/769
[58] Field of Search ................................. 438/25, 26, 27, 438/64, 65, 117; 361/741, 756, 769, 787; 257/718, 719, 726, 727, 730

[56] References Cited

U.S. PATENT DOCUMENTS 5,920,120 7/1999 Webb et al. ............................. 257/719

FOREIGN PATENT DOCUMENTS 5-102448 4/1993 Japan ............................. H01L 27/14

*Primary Examiner*—David Nelms
*Assistant Examiner*—David Vu
*Attorney, Agent, or Firm*—Sughrue, Mion, Zinn, Macpeak & Seas, PLLC

[57] ABSTRACT

First, a CCD package is attached to a plane of a flexible substrate. A reference plane, which is parallel to an image forming plane of a solid state imaging device chip, is formed at the top of the CCD package. The reference plane is brought into contact with a reference plane of an optical unit, and a leaf spring presses the CCD package so that the CCD package can be fixed to the optical unit.

12 Claims, 7 Drawing Sheets

F I G. 6
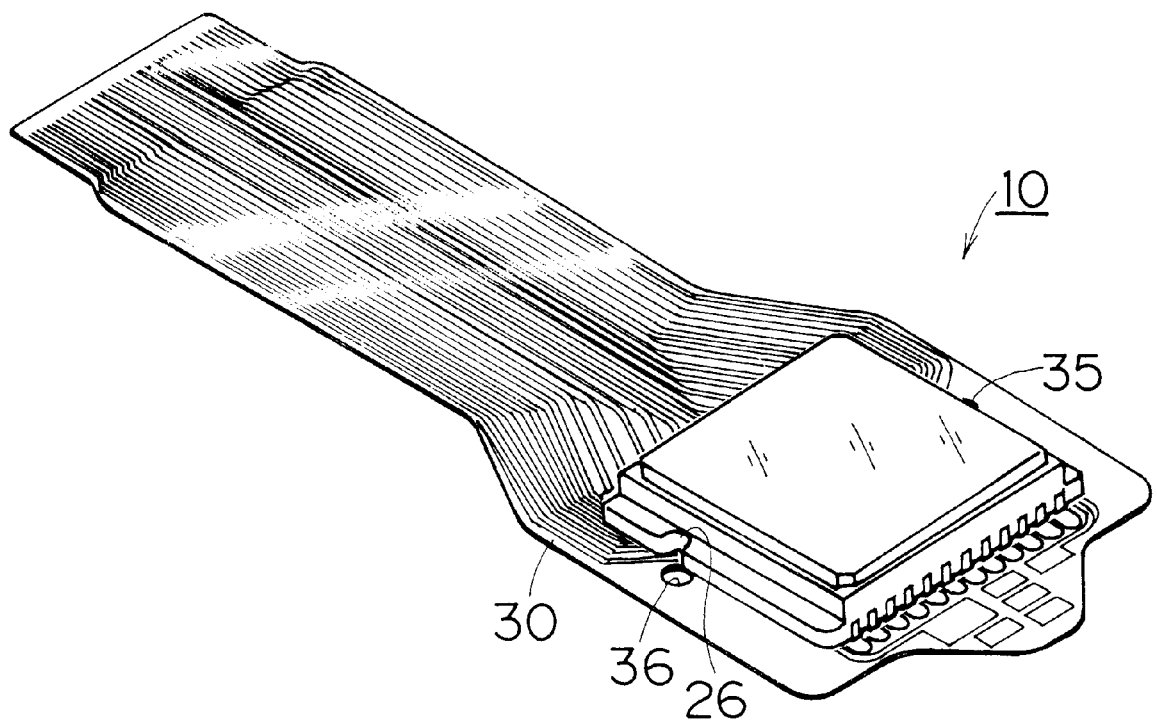

METHOD OF ATTACHING SOLID STATE IMAGING DEVICE

BACKGROUND OF THE INVENTION

1. Field of the Invention

The present invention relates generally to a method of attaching a solid state imaging device, and more particularly to a method of attaching a solid state imaging device, which reduces the thickness required for the attachment and realizes the accurate attachment of the solid state imaging device.

2. Description of Related Art

In a conventional method of attaching a solid state imaging device to an optical unit, a package 2 loaded with a solid state imaging device chip 1 is mounted on a CCD substrate (not illustrated) through an aluminum board 3 as shown in FIG. 11. An optical low-pass filter 5, a rubber member 6 and the package 2 are sequentially inserted into the optical unit 4 from behind. The aluminum board 3 is fixed to the optical unit 4 by screws 7 or adhesives. Incidentally, the package 2 may be directly mounted on the CCD substrate with a predetermined strength without providing the aluminum board 3, and the CCD substrate may be fixed to the optical unit 4.

If the package 2 is attached to the optical unit 4 as stated above, however, the positional accuracy of a light receiving plane of the solid state imaging device chip 1 with respect to a reference plane 4A of the optical unit 4 depends on the planar accuracy of an attachment plane 7A of the aluminum board 3 and the difference in height between the light receiving plane of the solid state imaging device chip 1 and the attachment plane 7A of the aluminum board 3. It is therefore difficult to accurately position the light receiving plane of the solid state imaging device chip 1.

On the other hand, there is proposed a solid state imaging device which has a vertically positioning piece projecting from a side wall of a package horizontally (Japanese Patent Provisional Publication No. 5-102448). The vertically positioning piece comes into contact with a solid state imaging device attachment part of optical equipment in order to maintain the accurate verticality of the light receiving plane of the solid state imaging device.

To attach the solid state imaging device to the solid state imaging attachment of the optical equipment, the Japanese Patent Provisional Publication No. 5-102448 discloses using adhesives or screws or attaching the solid state imaging device to a printed board and then fixing the printed board to the solid state imaging device attachment part through screws.

In the conventional method of attaching the solid state imaging device, however, the thickness of the aluminum board 3 and the CCD substrate (not illustrated) or the projection of leads 8 increases the thickness along an optical axis as shown in FIG. 11.

If the adhesive is used as mentioned in the Japanese Patent Provisional Publication No. 5-102448, it is troublesome to attach the solid state imaging device to the solid state imaging device attachment part of the optical equipment. If the screws are used, it is necessary to form screw holes must be formed in the vertically positioning piece and therefore the vertically positioning piece must be large. Furthermore, if the solid state imaging device is previously attached to the solid state imaging device attachment part of the optical equipment as stated above, it is very troublesome to solder the leads of the solid state imaging device with terminals of the substrate. Incidentally, if the solid state imaging device is mounted on the substrate and then the substrate is attached to the solid state imaging device attachment part, the positional accuracy is deteriorated as described with reference to FIG. 11.

SUMMARY OF THE INVENTION

The present invention has been developed in view of the above-described circumstances, and has as its object the provision of a method of attaching a solid state imaging device, the method which reduces the thickness required for the attachment of the solid state imaging device to thereby reduce the size of the camera, and attaches the solid state imaging device to the optical unit accurately and easily.

To achieve the above-mentioned object, the present invention is directed to a method of attaching a solid state imaging device, comprising the steps of: forming reference planes at the top of a package, on which a solid state imaging device chip is mounted, the reference planes being parallel to an image forming plane of the solid state imaging device chip; and bringing the reference planes of the package into contact with a reference plane of an optical unit and pressing the package with an elastic member to thereby fix the package to the optical unit.

The present invention is also directed to a method of attaching a solid state imaging device, comprising the steps of: forming reference planes at the top of a package loaded with a solid state imaging device chip, the reference planes being parallel to an image forming plane of the solid state imaging device chip, and providing contact terminals for mounting the package on a plane of a flexible substrate; mounting the package on the plane of the flexible substrate; bringing the reference planes of the package mounted on the plane of the flexible substrate into contact with reference planes of an optical unit and fixing the package to the optical unit.

More specifically, the reference plane of the package comes into contact with the reference plane of the optical unit in order to maintain the accurately verticality between the optical axis of the optical unit and the image forming plane of the solid state imaging device chip. When the package is attached, the elastic member presses the package against the optical unit. For this reason, it is possible to fix the package without fail even if the reference plane of the package projects a little. In particular, the package is mounted on the plane of the flexible substrate, and the leaf spring is used as the elastic member, thus reducing the thickness at the back of the package necessary for the attachment.

Since the package is mounted on the plane of the flexible substrate, the rigidity of the flexible substrate is not an obstacle to the positioning of the package. Moreover, the thickness at the back of the package is held to a minimum since the flexible substrate is thin.

According to the present invention, two adjacent sides of the package are brought into contact with a positioning member of the optical unit in order to perform positioning and rotational positioning within an image forming plane of the solid state imaging device chip. In addition, two positioning holes or cuts are formed at the edge of the package to bring the reference plane of the package into contact with the reference plane of the optical unit, and positioning pins provided at the optical unit are inserted into the two positioning holes or cuts.

In addition, two positioning holes or cuts are formed at the edge of the package and two positioning holes are formed in the flexible substrate correspondingly to the two positioning holes or cuts; and the two positioning holes of the flexible substrate and the two positioning holes or cuts of the package are inserted into two bosses of a positioning jig when the package is mounted on the plane of the flexible substrate, thereby positioning the flexible substrate and the package.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 6 is a perspective view of the flexible substrate to which the CCD package is attached;

DETAILED DESCRIPTION OF THE PREFERRED EMBODIMENT

This invention will hereafter be described in further detail by way of example with reference to the accompanying drawings.

A description will be given of the structure of a solid state imaging device according to the present invention.

Figure 1:
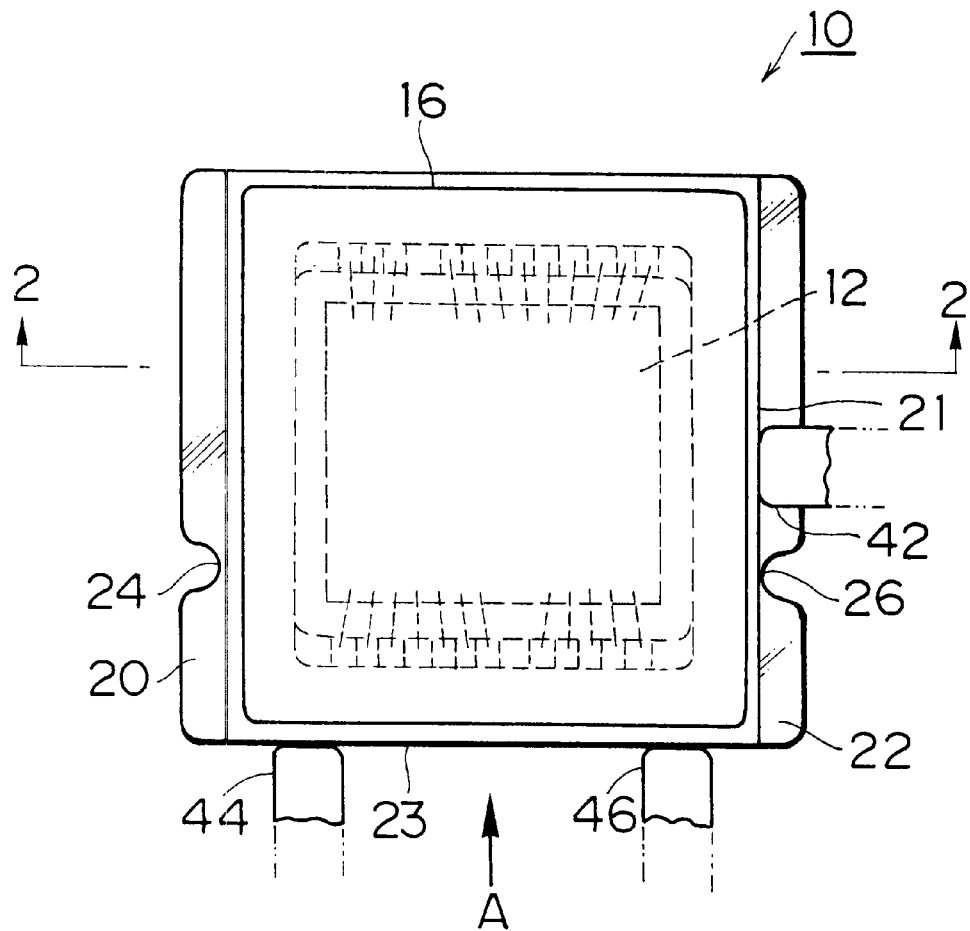
FIG. 1 is a plan view of a solid state imaging device (a CCD package) according to the present invention.
Figure 2:
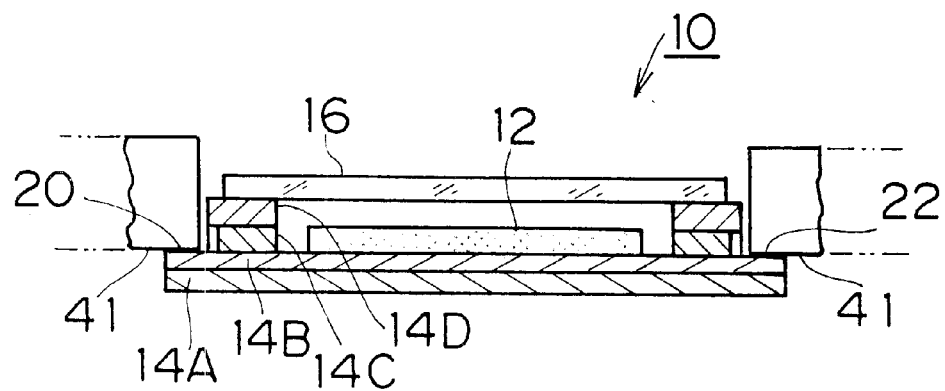
FIG. 2 is a sectional view taken along line 2—2 in FIG. 1.

FIG. 1 is a plan view showing a package 10 (hereafter be referred to as a CCD package), which includes a solid state imaging device chip 12. FIG. 2 is a sectional view taken along line 2—2 in FIG. 1.

As shown in FIGS. 1 and 2, the CCD package 10 is comprised mainly of the solid state imaging device chip 12, ceramic boards 14A–14D and a cover glass 16.

The solid state imaging device chip 12 is loaded on the ceramic board 14B. The ceramic boards 14A–14D are attached to one another, and the cover glass 16 is attached to the ceramic board 14D.

The ceramic boards 14A, 14B are wider than the ceramic boards 14C, 14D, and therefore, the ceramic boards 14A, 14B partially project on both sides. The upper planes of the projecting parts are reference planes 20, 22 for determining a verticality between an optical axis of an optical unit and an image forming plane of the solid state imaging device chip 12. U-shaped cuts 24, 26 are formed at both projecting parts.

Incidentally, the reference planes 20, 22 are flush with the upper plane of the ceramic board 14B, on which the solid state imaging device chip 12 is loaded.

Figure 3:
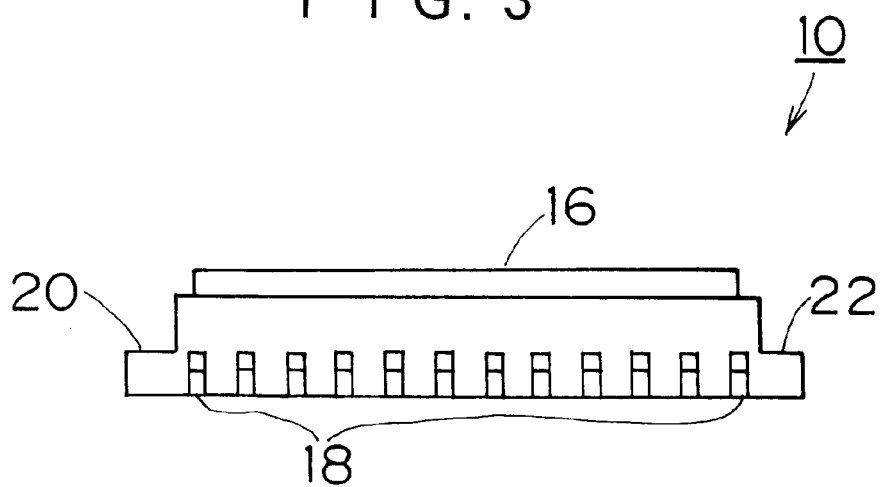
FIG. 3 is a side view of the CCD package in FIG. 1 along an arrow A.
Figure 4:
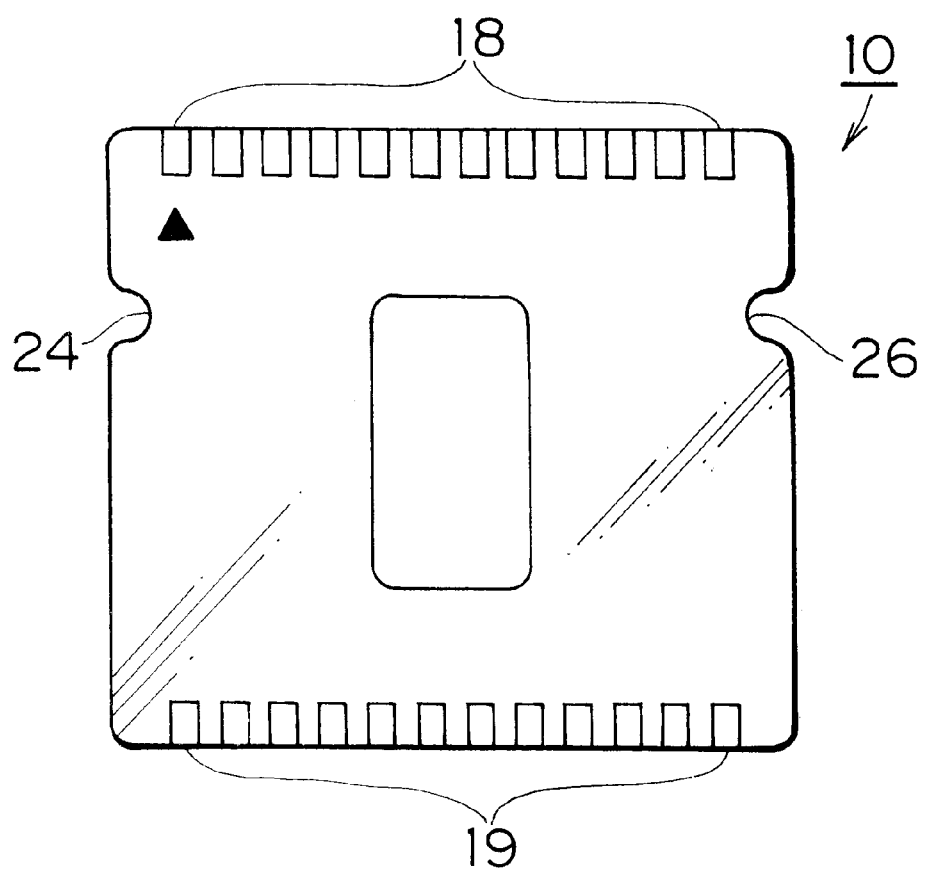
FIG. 4 is a back view of the CCD package.

FIG. 3 is a side view of the CCD package 10, taken along an arrow A in FIG. 1. FIG. 4 is a back view of the CCD package 10. As shown in FIGS. 3 and 4, a plurality of contact terminals 18, 19 are provided from the sides to the bottom so that they can be exposed. This enables the CCD package 10 to be loaded on the plane of the substrate. Incidentally, terminals on the solid state imaging device chip 12 and the contact terminals 18, 19 are bonded through aluminum wires, metal wires, etc.

A description will now be given of a method of attaching the CCD package 10 to the optical unit.

Figure 5:
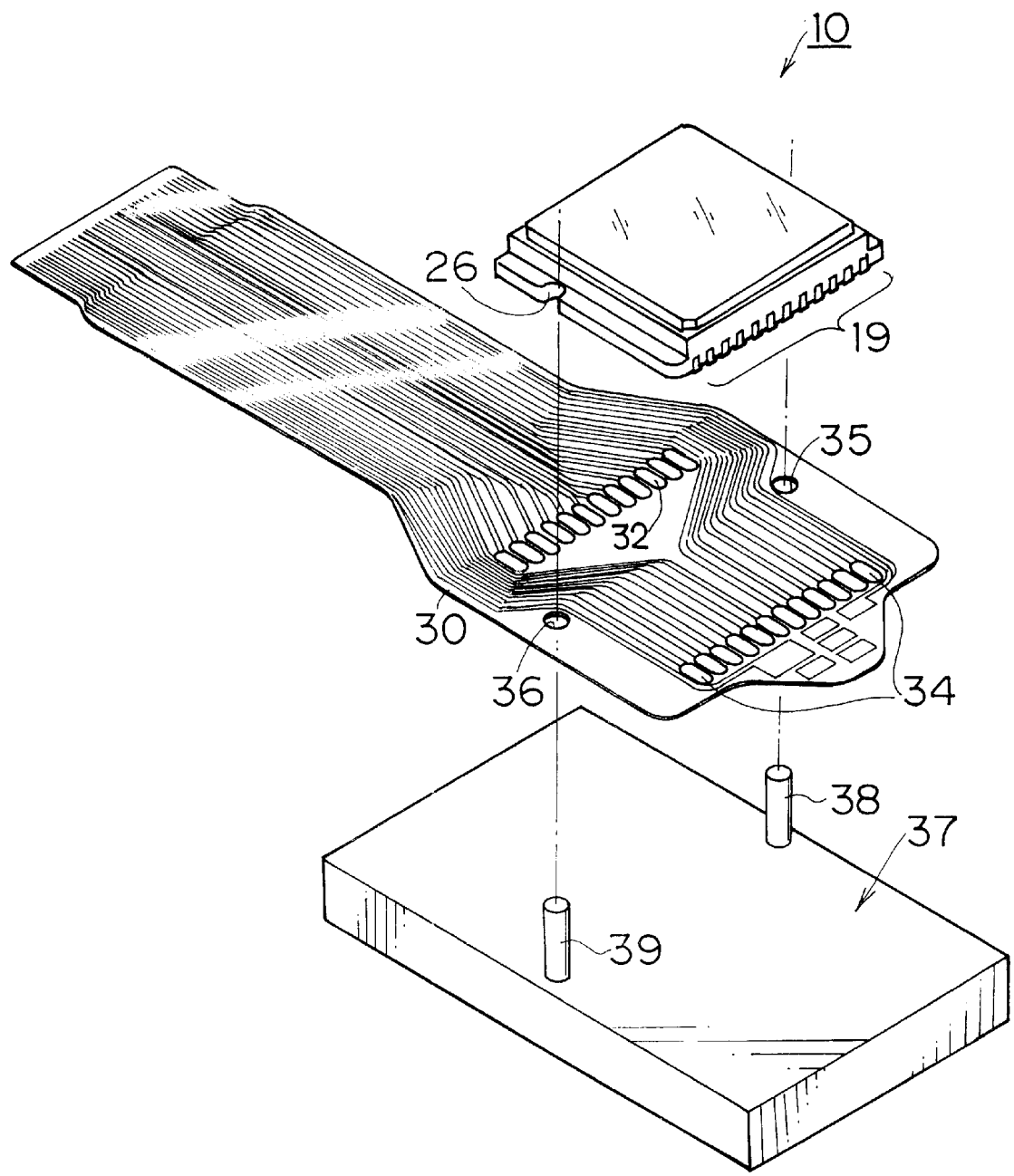
FIG. 5 is a perspective view of assistance in explaining how the CCD package is aligned with a flexible substrate to which the CCD package is attached.

First, the CCD package 10 is attached to the plane of a flexible substrate 30 as shown in FIGS. 5 and 6. First, the CCD package 10 is aligned with the flexible substrate 30 as shown in FIG. 5.

More specifically, positioning holes 35, 36 are formed correspondingly to the cuts 24, 26 formed in the CCD package 10. The flexible substrate 30 is placed on a jig 37 in such a way that two bosses 38, 39 on the jig 37 can be inserted into the positioning holes 35, 36 of the flexible substrate 30. Then, the CCD package 10 is placed on the jig 37 in such a way that the bosses 38, 39 can be inserted into the cuts 24, 26 can be inserted into the bosses 38, 39. Consequently, the CCD package 10 is aligned with the flexible substrate 30 (in other words, the contact terminals 18, 19 (see FIG. 4) of the package 10 are aligned with contact terminals 32, 34 on the flexible substrate 30).

The contact terminals 18, 19 of the CCD package 10 are soldered to the contact terminals 32, 34 of the flexible substrate 30 in a reflow soldering method such as a soldering iron heating method, a pulse heater heating method and an infrared heating reflow method. FIG. 6 shows the state wherein the CCD package 10 is attached to the plane of the flexible substrate 30 and they are separate from the jig 37.

Figure 7:
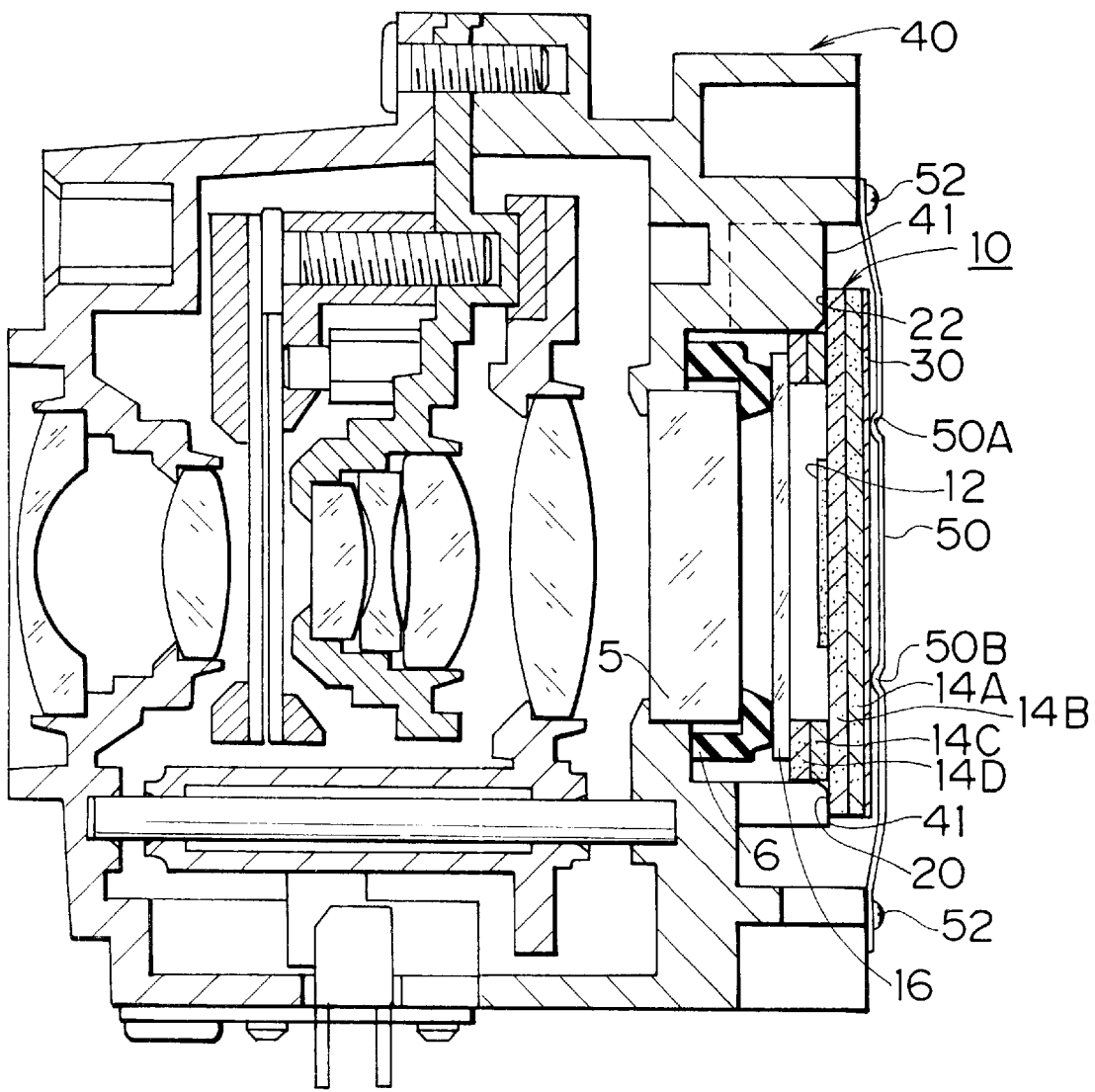
FIG. 7 is a sectional view of an optical unit to which the CCD package is attached according to the present invention.

Thereafter, as shown in FIG. 7, an optical low-pass filter 5, a rubber member 6 and the CCD package 10 (see FIG. 6) attached to the plane of the flexible substrate 30 are sequentially inserted into the optical unit 40 from behind.

The side of at least one of the ceramic boards 14C, 14D comes into contact with the inside of the optical unit 40 (a lens barrel mold). More specifically, three positioning members 42, 44, 46 are provided at the optical unit as shown in FIG. 1, and elastic pressing pieces (not illustrated) are integrated with the optical unit at the opposite sides of the positioning members 42, 44, 46. The CCD package 10 is inserted into the optical unit against the force of the pressing pieces, and therefore, a side 21 of the CCD package 10 comes into contact with the positioning member 42 of the optical unit. A side 23 of the CCD package 10 comes into contact with the positioning members 44, 46 of the optical unit.

Consequently, the image forming plane of the solid state imaging device chip 12 is positioned within the plane (in other words, the center of an effective imaging plane of the solid state imaging device chip 12 is aligned with the optical axis of the optical unit 40), and the rotation of the effective imaging plane is positioned.

For the above positioning, the cuts 24, 26 formed at both projecting parts may be coupled to the positioning pins of the optical unit. Instead of the cuts 24, 26, a round hole and a slit (groove) for regulating the rotational direction may be formed at both projecting parts so that they can be used for positioning.

Then, as shown in FIG. 7, a leaf spring 50 is pressed against the back plane of the flexible substrate 30, and the leaf spring 50 is fixed to the optical unit 40 through screws 52. The leaf spring 50 presses the CCD package 10 against the optical unit 40 with its force. Consequently, the reference planes 20, 22 contact with the reference plane 41, and they are fixed.

It is therefore possible to keep the accurate verticality between the optical axis of the optical unit 40 and the image forming plane of the solid state imaging device chip 12. It is also possible to accurately position the image forming plane of the solid state imaging device 12 along the optical axis of the optical unit 40.

Incidentally, two convex parts 50A, 50B of the leaf spring 50 press the back plane of the flexible substrate 30, but only one convex part may press the back plane of the flexible substrate 30. The leaf spring 50 preferably presses an area with no wiring pattern on the flexible substrate 30. Further, a hole is formed in the flexible substrate 30, and the back plane of the CCD package 10 may be pressed directly through the hole.

In this embodiment, the reference planes of the CCD package 10 are formed on the upper plane of the ceramic board 14B, on which the solid state imaging device chip 12 is mounted. The present invention, however, should not be restricted to this. For example, the reference planes may be formed on the upper plane of the ceramic board 14D, which is the highest layer. Since the thick ceramic board is difficult to have a uniform thickness, a plurality of ceramic boards are stacked to form the package. The number of ceramic boards is not restricted to this embodiment. Instead of the ceramic boards, boards made of another material (with a uniform thickness) may be stacked to form the package. The package may also be molded with metal or resin.

Figure 8:
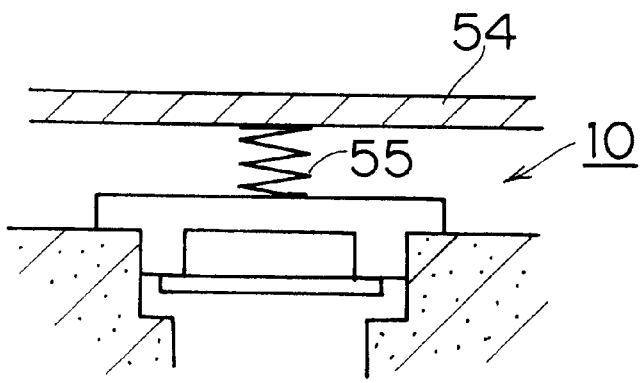
FIG. 8 is a sectional view showing another embodiment in which the CCD package is pressed toward the optical unit.
Figure 9:
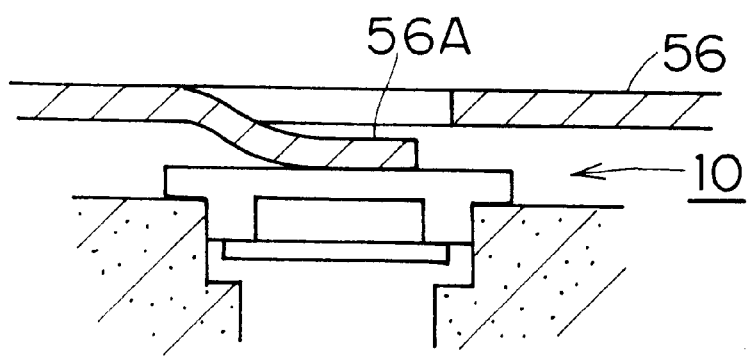
FIG. 9 is a sectional view showing another embodiment in which the CCD package is pressed toward the optical unit.
Figure 10:
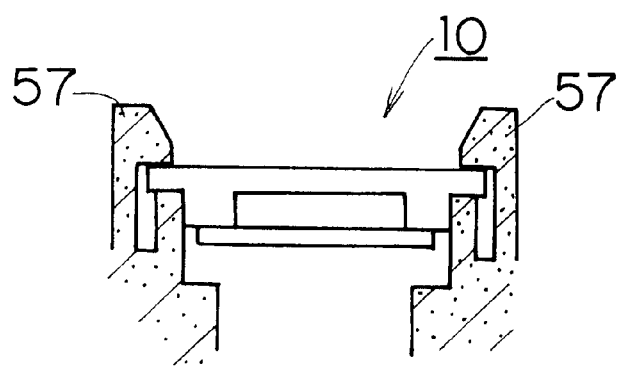
FIG. 10 is a sectional view showing another embodiment in which the CCD package is pressed toward the optical unit.
Figure 11:
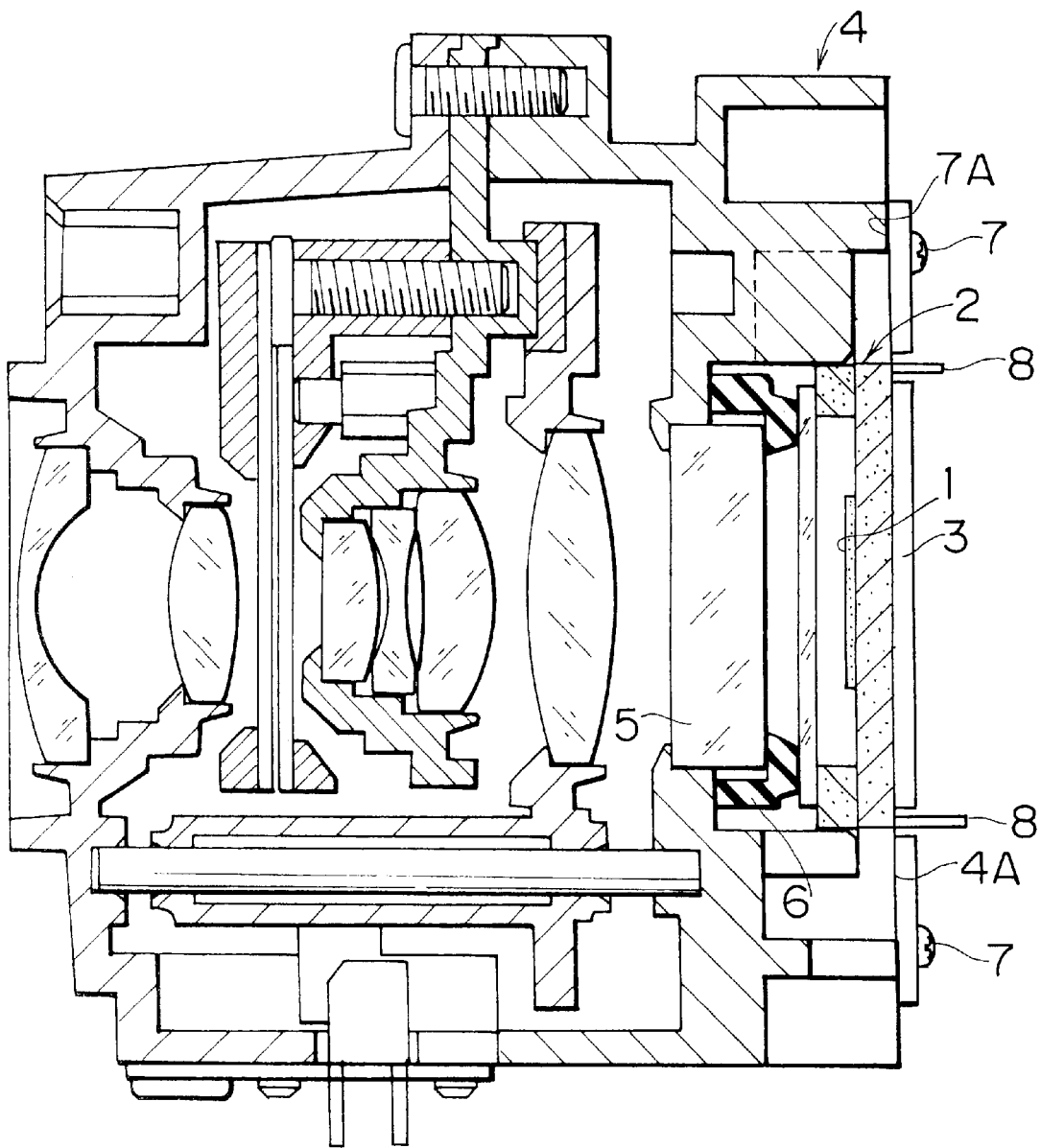
FIG. 11 is a sectional view of the optical unit to which the CCD package is attached in the prior art.

The elastic member for pressing the CCD package is not restricted to the leaf spring 50 fixed to the optical unit 40, and a variety of other elastic members may be used. For example, it is possible to use a spring member such as a coil spring 55, which is arranged between a rear cabinet 54 and the CCD package 10 as shown in FIG. 8. It is also possible to use an elastic cutting piece 56A integrated with a rear cabinet 56, or a snap fitting part 57 integrated with the lens barrel mold of the optical unit as shown in FIG. 10.

As set forth hereinabove, in the method of attaching the solid state imaging device according to the present invention, the upper plane of the package, which is parallel to the image forming plane of the solid state imaging device, is the reference plane, which comes into contact with the reference plane of the optical unit, and the elastic member presses the package so that the package can be fixed to the optical unit. It is therefore possible to maintain the accurate verticality between the optical axis of the optical unit and the image forming plane of the solid state imaging device chip, and it is also possible to accurately position the image forming plane along the optical axis. When the package is attached, the elastic member presses the package against the optical unit. Thus, it is possible to fix the package without fail even if the reference plane of the package projects only a small amount. In particular, since the package is attached to the plane of the flexible substrate and the leaf spring presses the back plane of the package, the thickness at the back of the package required for the attachment can be reduced, and this reduces the thickness of the camera. Incidentally, the package is attached to the plane of the flexible substrate, and thus, the rigidity of the flexible substrate is not an obstacle to the positioning of the package.

Further, the thickness of the package at the backside thereof can be reduced to a minimum due to the thin flexible substrate.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of attaching a solid state imaging device, comprising the steps of:

forming a reference plane at the top of a package, on which a solid state imaging device chip is mounted, said reference plane being parallel to an image forming plane of said solid state imaging device chip; and bringing said reference plane of said package into contact with a reference plane of an optical unit and pressing said package with an elastic member to thereby fix said package to said optical unit.

2. The method of attaching the solid state imaging device as defined in claim 1, wherein said elastic member is a leaf spring arranged in said optical unit, and said leaf spring and said optical unit pinch said package with elasticity.

3. The method of attaching the solid state imaging device as defined in claim 1, wherein said package is constructed in such a way that a plurality of boards with uniform thickness are stacked, and the reference plane of said package is at the top of the boards loaded with said solid state imaging device chip.

4. The method of attaching the solid state imaging device as defined in claim 1, further comprising the step of bringing two adjacent sides of said package into contact with positioning members of said optical unit to thereby perform positioning and rotational positioning within an image forming plane of said solid state imaging device chip.

5. The method of attaching the solid state imaging device as defined in claim 1, further comprising the step of forming two positioning holes or cuts at the edge of said package, inserting positioning pins of said optical unit into said two positioning holes or cuts to thereby perform positioning and rotational positioning within said image forming plane of said solid state imaging device chip.

6. A method of attaching a solid state imaging device, comprising the steps of:

forming a reference plane at the top of a package loaded with a solid state imaging device chip, said reference plane being parallel to an image forming plane of said solid state imaging device chip, and providing contact terminals for mounting said package on a plane of a flexible substrate;

mounting said package on the plane of said flexible substrate;

bringing said reference plane of said package mounted on the plane of said flexible substrate into contact with a reference plane of an optical unit and fixing said package to said optical unit.

7. The method of attaching the solid state imaging device as defined in claim 6, wherein said package is fixed to said optical unit in such a way that an elastic member presses said package against said optical unit.

8. The method of attaching the solid state imaging device as defined in claim 7, wherein said elastic member is a leaf spring arranged in said optical unit, and said leaf spring and said optical unit pinch said package with elasticity.

9. The method of attaching the solid state imaging device as defined in claim 6, wherein said package is constructed in such a way that a plurality of boards with uniform thickness are stacked, and said reference plane of said package is the top of the boards loaded with said solid image stating device chip.

10. The method of attaching the solid state imaging device as defined in claim 6, further comprising the step of bringing two adjacent sides of said package into contact with positioning members of said optical unit in order to perform positioning and rotational positioning within an image forming plane of the solid state imaging device chip.

11. The method of attaching the solid state imaging device as defined in claim 6, further comprising the steps of forming two positioning holes or cuts at the edge of said package, and inserting positioning pins provided at said optical unit into said two positioning holes or cuts to thereby perform positioning and rotational within said image forming plane of said solid state imaging device chip.

12. The method of attaching the solid state imaging device as defined in claim 6, further comprising the steps of:

forming two positioning holes or cuts at the edge of said package and forming two positioning holes in said flexible substrate correspondingly to said two positioning holes or cuts; and inserting two bosses of a positioning jig into said two positioning holes of said flexible substrate and said two positioning holes or cuts of said package to thereby position said flexible substrate and said package when said package is mounted on the plane of said flexible substrate.

* * * * *